United States Patent [19]

Nakano et al.

[11] Patent Number: 4,673,773
[45] Date of Patent: Jun. 16, 1987

[54] MULTILAYER PRINTED CIRCUIT BOARD

[75] Inventors: Tsunetomo Nakano; Hiroshi Yasuno; Kazuaki Nishio, all of Ichihara, Japan

[73] Assignee: Ube Industries, Ltd., Ube, Japan

[21] Appl. No.: 705,745

[22] Filed: Feb. 26, 1985

[30] Foreign Application Priority Data

Feb. 27, 1984 [JP] Japan .................. 59-35770

[51] Int. Cl.$^4$ ............................. H05K 1/14
[52] U.S. Cl. .................... 174/68.5; 528/125; 528/126; 528/128; 528/183; 528/184; 528/186; 528/220; 528/229; 528/338; 528/340; 528/342; 528/345; 528/348; 361/414; 430/283
[58] Field of Search ............... 528/125, 126, 128, 183, 528/184, 186, 220, 229, 338, 340, 342, 345, 348; 361/414; 430/283; 174/68.5

[56] References Cited

U.S. PATENT DOCUMENTS 4,397,999  8/1983  Ahne et al. ................. 528/345
4,496,794  1/1985  Darms et al. ................ 174/68.5
4,511,757  4/1985  Ors et al. .................. 174/68.5

Primary Examiner—John Kight
Assistant Examiner—M. L. Moore
Attorney, Agent, or Firm—Frishauf, Holtz, Goodman & Woodward

[57] ABSTRACT

In a multilayer printed circuit board comprising an insulating substrate and a plurality of circuit elements provided thereon in layers, each of which is composed of a circuit pattern and an insulating resin layer provided over the circuit pattern, the circuit patterns arranged adjacently to each other being portionwise connected electrically through via at least one hole, the improvement in which said insulating resin layer comprises a photoset resin of an aromatic polyamide having at least 10 molar % of a constitutional unit of the formula (Ia):

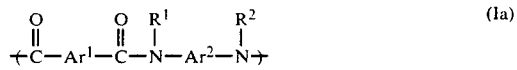

(Ia)

wherein each of $R^1$ and $R^2$ independently is a hydrogen atom or a residue of a reactive organic compound, $Ar^1$ is a divalent aromatic residue, and $Ar^2$ is a divalent aromatic residue possessing a photosensitive group.

8 Claims, 2 Drawing Figures

MULTILAYER PRINTED CIRCUIT BOARD

BACKGROUND OF THE INVENTION

1. Field of the Invention

The present invention relates to a multilayer printed circuit board. More particularly, the invention relates to a multilayer printed circuit board having improved heat resistance and excellent electrical and mechanical properties, and a process for producing the same.

2. Description of Prior Arts

Previously, most of solid-state elements or parts mounted to a printed circuit board have been in the form of individual parts including active elements and passive elements. However, along the technological development, the tendency is clear that IC or LSI shall be more densely mounted to a printed circuit board. A printed circuit board is expected to have the capacity of more dense and intricate mountings.

However, the conventional process for producing a printed circuit board is not employable to produce a densely mounted circuit board, and a new process for enabling the production of a highly dense circuit in the form of a multilayer board is expected.

For example, in order to increase the number of circuit lines on a printed circuit board, a plating through hole process to produce multilayer structure has been widely used. However, in this process the circuit area space of the circuit pattern is restricted by the space of land portion. This means that the conventional process inherently possesses a defect in which the circuit area space is more reduced, as the number of layer of a printed circuit board is increased. This is because the number of through holes for connecting layers should be increased, as the number of layers are increased. Therefore, as far as the conventional process is concerned, it is almost impossible to produce, in view of both materials and precisions, ten or more layers while minimizing the line width and the size of the through hole. Accordingly, a new circuit-producing technology is required to give a printed circuit board having an increased number of circuit layers.

In order to meet the above-mentioned requirements, it can be thought that a process forming the via hole using the photofabrication technology. More particularly, this process comprises the following steps of: forming a circuit pattern of the first layer over an insulating substrate; forming a photo-polymer layer over the circuit pattern; exposing the photo-polymer layer to radiation to photoset the polymer layer except for a predetermined portion where at least one via hole is formed; developing the exposed layer to produce a photoset polymer film of the first layer having at least one via hole therein; forming a circuit parttern of the second layer over the photoset polymer film of the first layer; and repeating the above-described steps of forming a photo-polymer layer and producing a photoset polymer film having at least one via hole to prepare a multilyaer printed circuit pattern on the substrate.

To produce a multilayer printed circuit board by the above-described process, the photo-polymer is required to possess various specific properties appropriate as a fine photosensitive material and further to possess an appropriate property for forming the interlaminar insulating film, but the conventional photo-polymers hardly fullfill such required properties and are considered to be unsatisfactory for the production of the above-described multilayer structure.

SUMMARY OF THE INVENTION

The present invention is characterized in that the insulating resin layer comprises a photoset resin of a specifically selected aromatic polyamide.

More particularly, the present invention provides a multilayer printed circuit board comprising an insulating substrate and a plurality of circuit elements provided thereon in layers, each of which is composed of a circuit pattern and an insulating resin layer provided over the circuit pattern, the circuit patterns arranged adjacently to each other being portionwise connected electrically through via at least one hole, in which the insulating resin layer comprises a photoset resin of an aromatic polyamide having at least 10 molar % of a constitutional unit of the formula (Ia):

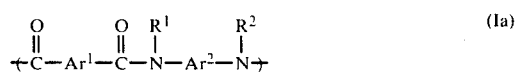

wherein each of $R^1$ and $R^2$ independently is a hydrogen atom or a residue of a reactive organic compound, $Ar^1$ is a divalent aromatic residue, and $Ar^2$ is a divalent aromatic residue possessing a photosensitive group.

The multilayer printed circuit board of the present invention can be produced by a possess comprising steps of: forming a circuit pattern of the first layer over an insulating substrate; forming a photo-polymer layer over the circuit pattern; exposing the photo-polymer layer to radiation to photoset the polymer layer except for a predetermined portion where at least one via hole is formed; developing the exposed film to produce a photoset polymer film of the first layer having at least one via hole therein; forming a circuit pattern of the second layer over the photoset polymer film of the first layer; and repeating the above-stated steps of forming a photopolymer layer and forming a photoset polymer film having at least one via hole to prepare a multilayer printed circuit pattern on the substrate, in which the step for forming the photo-polymer layer is performed by coating a photosensitive polymer solution of 3 to 50% by weight of an aromatic polyamide having at least 10 molar % of a constitutional unit of the above-described formula (Ia) in an organic solvent over the circuit pattern and drying the coated solution layer.

DETAILED DESCRIPTION OF THE INVENTION

Figure 1:
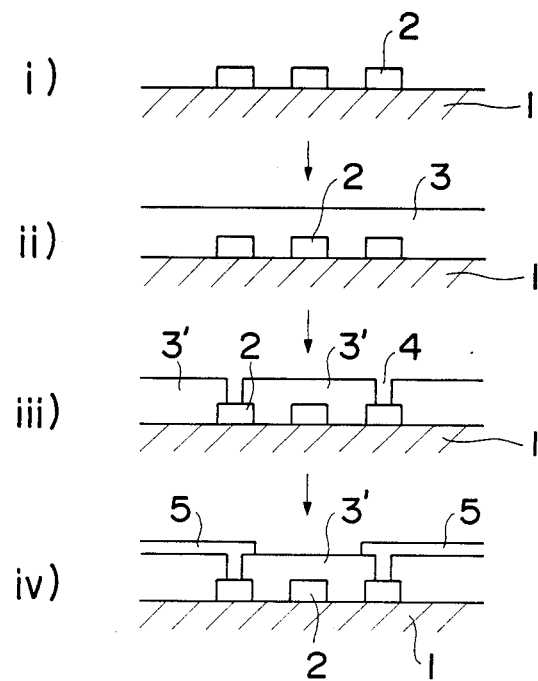
FIG. 1 schematically illustrates the steps of producing a multilayer printed circuit board, and FIG. 2 shematically illustrates a portion of a multilayer printed circuit board having via holes.

The photo-polymer (i.e., photosensitive polymer) used as a photosensitive resin component in the invention is an aromatic polyamide having at least 10 molar %, preferably at least 20 molar %, more preferably at least 40 molar % of a constitutional unit defined by the above-mentioned formula (Ia). The constitutional unit of the formula (Ia) can be present in the polyamide in a proportion of 80 to 100 molar %. The polyamide may further have at most 90 molar %, specifically at most 80 molar %, more specifically at most 60 molar % of a constitutional unit defined by the following formula (Ib):

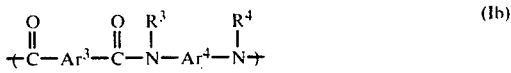

wherein each of $R^3$ and $R^4$ independently is a hydrogen atom or a residue of a reactive organic compound, and each of $Ar^3$ and $Ar^4$ independently is a divalent aromatic residue.

In the formulae (Ia) and (Ib), a divalent aromatic residue of an aromatic dicarboxylic acid compound can be mentioned as the aromatic residues represented by $Ar^1$ and $Ar^3$. The aromatic dicarboxylic acid can be selected, for example, from terephthalic acid, isophthalic acid, 4,4'-dicarboxy-biphenyl, 4,4'-dicarboxy-diphenylmethane and 4,4'-dicarboxy-diphenyl ether. The aromatic dicarboxylic acid is preferably in the form of an acid halide, and more preferably, an acid chloride.

In the formula (Ia), a divalent aromatic residue of an aromatic diamine compound can be mentioned as the aromatic residue possessing a photosensitive group represented by $Ar^2$. The aromatic diamine compound can be selected from, for example; benzoic acid esters, such as 3,5-diaminobenzoic acid ethyleneglycol monoacrylate ester, 2,4-diaminobenzoic acid ethyleneglycol monoacrylate ester, 3,5-diaminobenzoic acid ethyleneglycol monomethacrylate ester, 2,4-diaminobenzoic acid ethyleneglycol monomethacrylate ester, 3,5-diaminobenzoic acid glycidyl acrylate ester, 2,4-diaminobenzoic acid glycidyl acrylate ester, 3,5-diaminobenzoic acid glycidyl methacrylate ester, 2,4-diaminobenzoic acid glycidyl methacrylate ester, 3,5-diaminobenzoic acid cinnamate ester, and 2,4-diaminobenzoic acid cinnamate ester; benzyl acrylates, such as 3,5-diaminobenzyl acrylate, 3,5-diaminobenzyl methacrylate, 2,4-diaminobenzyl acrylate and 2,4-diaminobenzyl methacrylate; diphenyl ethers, such as 4-acrylamido-3,4'-diaminodiphenyl ether, 2-acrylamido-3,4'-diamidodiphenyl ether, 3,4'-diaminodiphenyl etter, 4-cinnamamido-3,4'-diaminodiphenyl ether, 3,4'-diacrylamido-3',4-diaminodiphenyl ether, 4,4'-dicinnamamido-3',4-diaminodiphenyl ether, 4-methyl-2'-carboxyethylmethacrylate ester-3,4'-diaminodiphenyl ether (the carboxyethylmethacryl acid ester here means $CH_2=C(CH_3)COOCH_2CH_2OOC-$), and 4-methyl-2'-carboxyethylacrylate ester-3,4'-diaminodiphenyl ether (carboxyethylmethacryl acid ester here means $CH_2=CHCOOCH_2CH_2OOC-$): and chalcones such as 4,4'-diaminochalcone, 3,3'-diaminochalcone, 3,4'-diaminochalcone, 3',4-diaminochalcone, 4'-methyl-3',4-diaminochalcone, 4'-methoxy-3',4-diaminochalcone, and 3'-methyl-3,5-diaminochalcone.

In the formula (Ib), a divalent aromatic residue of an aromatic diamine possessing no photosensitive group can be mentioned as the aromatic residue represented by $Ar^4$. The aromatic diamine compound can be selected from, for example; diamine compounds, such as p-phenylene diamine, m-phenylene diamine, 2,4-diaminotoluene, 4,4'-diaminodiphenylether, 4,4'-diaminodiphenylmethane, o-toluidine, o-tolidine sulfone, 1,4-bis(4-aminophenoxy)benzene, and 2,2'-bis(4-aminophenoxyphenyl)propane; and diamine compounds possessing keton group, such as 9,9-bis(4-aminophenyl)-10-anthrone, 1,5-diaminoanthraquinone, 1,4-diaminoanthraquinone, 3,3'-diaminobenzophenone, 4'-N,N-dimethylamino-3,5-diaminobenzophenone, and 1-dimethylamino-4-(3,5-diaminobenzoyl)naphthalene.

Among these compounds, diamines possessing ketone group are especially preferred because these particularly improve the sensitivity and resolving power of the polyamide.

In the formulae (Ia) and (Ib), the residue of a reactive organic compound represented by $R^1$, $R^2$, $R^3$ or $R^4$ is an organic group produced as a result of substitution between a hydrogen atom in an amido bond of the polyamide and a hydrogen atom of a reactive organic compounds (i.e., an organic compound reactive to the hydrogen atom in an amido bond of the polyamide). Examples of the residue include acetyl group, acryloyl group, methacryloyl group, cinnamoyl group and p-azidobenzoyl group. Acryloyl group, methacryloyl group and cinnamoyle group are especially preferred, because these particularly improve the sensitivity and resolving power of the polyamide. Reactive organic compounds capable of giving the above residues are, for example, methacrylic acid chloride, acrylic acid chloride, cinnamic acid chloride, acetic acid chloride, benzyl chloride and p-azidobenzoyl chloride.

The presence of the constitutional unit defined by the formula (Ib) in the polyamide chain used in the present invention gives an effect of improving the thermal property of the polyamide. However, the content of the constitutional unit of the formula (Ib) preferably is not too excessive, because the content of the photosensitive group accordingly decreases and consequently the photosensitivity of the polyamide lowers.

The above-mentioned aromatic polyamide preferably shows a logarithmic viscosity in the range of 0.1 to 3.5, (specifically 0.2 to 2.0) when measured as the solution of 100 ml of N-methyl-2-pyrrolidone containing 0.5 g. of the polyamide at a temperature of 30° C.

The polyamide employed in the invention can be prepared by the procedure described below.

The polyamide in which all of $R^1$, $R^2$, $R^3$ and $R^4$ are hydrogen atoms can be prepared by polycondensation or copolycondensation between an aromatic dicarboxylic acid having the above-mentioned $Ar^1$ (or $Ar^3$) and an aromatic diamine consisting of 100 to 10 molar %, preferably 100 to 20 molar %, more preferably 100 to 40 molar %, of an aromatic diamine having a photosensitive group defined by the following formula (II) and 0 to 90 molar %, preferably 0 to 80 molar %, more preferably 0 to 60 molar %, of an aromatic diamine having no photosensitive group defined by the following formula (III):

wherein $Ar^2$ is a divalent aromatic residue having a photosensitive group, and

wherein $Ar^4$ is a divalent aromatic residue having no photosensitive group.

The above-stated reaction is preferably carried out through polymerization in an organic solvent at a temperature of 100° C. or below, more preferably 80° C. or below, for a period of 0.1 to 48 hours.

Examples of the organic solvent employable for the polymerization reaction include N,N-dimethylsulfoxide, N,N-dimethylformamide, N,N-dimethylacetonamide, N,N-diethylacetoamide, N-methyl-2-pyrrolidone and hexamethylene phosphoamide.

A polyamide in which at least one of $R^1$, $R^2$, $R^3$ and $R^4$ is a residue of a reactive organic compound can be prepared by introducing the reactive organic compound which has an organic residue corresponding to $R^1$, $R^2$, $R^3$ or $R^4$, into a reaction solution containing the above-described polycondensate or copolycondensate in which all of $R^1$, $R^2$, $R^3$ and $R^4$ are hydrogen atoms, and causing a substitution reaction at a temperature of 5° to 100° C. for 0.1 to 48 hours.

The photosensitive diaminodiphenyl ether, diamino benzoic acid ester and diaminobenzyl acrylate, any of which can be used as the aromatic diamine defined by the formula (II) to prepare the aromatic polyamide of the invention, are as such novel compounds. These compounds can be prepared by the process stated below.

(1) Synthesis of photosensitive diaminodiphenyl ether

Mono-(or di-)amino-dinitrophenyl ether obtained by hydrolysis of the corresponding mono-(or di-)acetylamidodinitrophenyl ether is caused to react with acrylic acid chloride. The resulting product is then reduced so as to give the desired aromatic diamine compound.

(2) Synthesis of photosensitive diaminobenzoic acid ester

Dinitrobenzoic acid chloride is caused to react with hydroxyethyl methacrylate, and then the resulting product is reduced so as to give the desired aromatic diamine compound.

(3) Synthesis of photosensitive diaminobenzyl acrylate

Dinitrobenzyl alcohol is caused to react with acrylic acid chloride, and then the resulting product is reduced so as to give the desired aromatic diamine compound.

Among the aromatic diamines defined by the formula (III) employable for preparing the polyamide, compounds in which the aromatic residue represented by $Ar^4$ is the following residue:

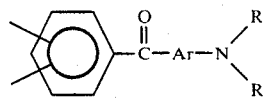

wherein Ar is an aromatic ring, and R is a methyl or ethyl group, for instance, the aforementioned 4'-N,N-dimethylamino-3,5-diaminobenzophenone, are also as such novel compounds. These can be prepared preferably by the following process.

Dinitrobenzoyl chloride is caused to react with aniline so as to give dinitrobenzanilide. Thereafter, the resulting product is caused to react with Ar—N(R)$_2$ and oxyphosphorous chloride and to the resulting product concentrated hydrochloric acid is added to prepare a compound having the formula:

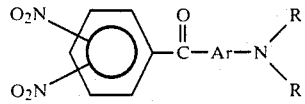

Finally, this compound is reduced to give the desired diamine compound.

Examples of the organic solvent which is employable for the preparation of the photosensitive resin solution in the invention include N,N-dimethylformamide, N,N-dimethylacetamide, N-methyl-2-pyrrolidone, dimethylsulfoxide 1,3-dimethyl-2-imidazolidinone, hexamethylphosphorite triamide and hexamethylene phosphoamide. The photosensitive resin solution is a solution in which the above-mentioned polyamide is homogeneously dissolved in an organic solvent at a concentration of approx. 3 to 50% by weight, preferably 5 to 40% by weight.

If required, a thermal polymerization inhibitor can be incorporated into the photosensitive resin solution. Example of the thermal polymerization inhibitor include hydroquinone, 2,6-di-t-butyl-4-methylphenol (BHT), methylether hydroquinone and benzoquinone. The thermal polymerization inhibitor is preferably employed in an amount of approx. 0 to 3 weight portion against 100 weight portion of the polyamide.

If required, a sensitizer and a photo-polymerization initiator can be incorporated into the photosensitive resin solution. Examples of the sensitizer and photopolymerization initiator include Michler's ketone, benzoin, benzoin methyl ether, benzoin ethyl either, benzoin isopropyl ether, 2-t-butylanthraquinone, 1,2-benzo-9,10-anthraquinone, 4,4'-bis(diethylamino)benzophenone, acetophenone, benzophenone, 1,5-acenaphthene, thioxanthone or its derivatives (e.g., chlorothioxanthone and methylthioxanthone) and anthranilic acid dimethylaminobenzoate. Each of these compounds can be used alone or in combination. The sensitizer and photo-polymerization initiator are preferably employed in an amount of approx. 1 to 10 weight portion against 100 weight potion of the polyamide.

The photosensitive resin solution employed in the invention is preferably in the form of a viscous transparent, preferably colorless, solution having a rotational viscosity of approx. 1 to 5,000 poise, preferably 5 to 1,000 poise, more preferably 10 to 500 poise at room temperature.

A process of producing a multilyaer printed circuit board of the invention is illustrated hereinbelow with reference to the attached FIGS. 1 and 2.

A representative process comprises following four steps.

Step (i). Formation of circuit pattern of first layer

On an insulating substrate 1, a circuit pattern 2 of the first layer is formed by an additive process or a photo-etching process. This step is generally carried out by the conventional process using a conventional photosensitive resin and a coppe coated insulating substrate.

Step (ii). Formation of photo-polymer layer

On the circuit pattern 2 of the first layer obtained in Step (i), the photosensitive resin solution is coated to form a thin layer having an average thickness of approx. 5 to 2,000 μm, preferably 10 to 1,000 μm, more preferably 30 to 800 μm, and the coated layer is then dried to give a photo-polymer layer 3 having an average thickness of approx. 2 to 200 μm, preferably 5 to 150 μm. The formation of this photo-polymer layer 3 results in covering the circuit pattern 2 on the first layer with the layer 3.

Step (iii). Formation of photoset film having at least one via hole

The photo-polymer layer 3 obtained in Step (ii) is covered by a predetermined positive photomask and exposed to radiation such as ultra-violet rays. Then, the unexposed portion of the layer is developed (i.e. washed away) with a solvent such as N-methyl-2-pyrrolidone. After the coated layer is developed and washed with water, the coated layer turns to a photoset film having via holes 4 at the predetermined portion through which the circuit pattern on the first layer is connectable. The photoset film serves as an interlaminar insulating layer 3'.

Step (iv). Formation of circuit pattern of second layer

A circuit pattern 5 of the second layer is formed on the interlaminar insulating film 3' obtained in Step (iii) and also at the via hole section 4. The semiadditive process can be used for the formation of the circuit pattern 5 of the second layer. In more detail, the interlaminar insulating film 3' is surface-treated, and an electroless copper plating is applied to the surface of the treated interlaminar insulating film 3' and also to the via hole section 4. The plated copper layer is then coated with a conventional photo-polymer and processed to provide a circuit pattern area of the second layer. On said area, copper is electroplated. Subsequently, the photoset film is removed, and then etching is applied to the electroless copper plated area leaving the electro copper plated area. In this manner, the electro copper plated circuit pattern 5 of the second layer is formed.

After Steps (i) to (iv) are complete, Steps (ii) to (iv) are repeated to produce the desired multilayer printed circuit board.

Figure 2:
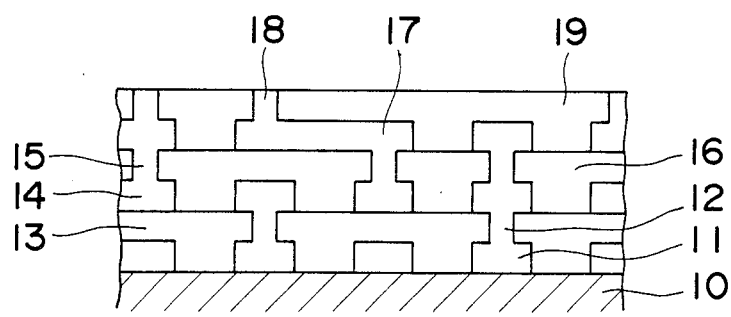

FIG. 2 given in the attached drawings schematically illustrates a portion of a three-layer printed circuit board having via holes, in which 10 indiates a substrate, 11 indicates a circuit pattern of the first layer, 12 indicates via holes in the first layer, 13 indicates the first interlaminar resin layer, 14 indicates a circuit pattern of the second layer, 15 indicates via holes in the second layer, 16 indicates the second interlaminar resin layer, 17 indicates a circuit pattern of the third layer, 18 indicates via holes of the third layer, 19 indicates the third resin layer.

In Steps (ii) and (iii), the procedure of coating and drying the photosensitive resin solution, and the procedure of exposure and development of the photopolymer film can be performed in the following manners.

The photosensitive resin solution is coated over the substrate by using, for example, a rotary coating machine. The coated layer is dried at a temperature not higher than 150° C., preferably not higher than 100° C. The drying procedure may be carried out under reduced pressure. After the layer is dried, a photomask chart of the negative type is placed on the coated layer, and actinic rays such as ultra-violet rays, visible light, electron beams or X rays are irradiated thereto. Then, the area not exposed to irradiation is washed away with a developer, and thus a relief pattern of the polyamide is obtained. The developer can be selected from solvents such as N,N-dimethylformamide, N,N-dimethylacetamide, dimethylsulfoxide, N-methyl-2-pyrrolidone, hexamethylenephosphoamide and diglyme, and a mixture of any of these solvents and methanol or ethanol.

The photosensitive material of the photosensitive resin solution used in the multilayer printed circuit board of the invention, i.e. the aforementioned aromatic polyamide, has a photosensitive group in the polymer chain and has excellent solubility in organic solvents. Therefore, the polyamide in an organic solvent can be used as a photosensitive resin solution which facilitates the formation of a circuit pattern by the photochemical procedures. In an instance a circuit pattern is formed, the above-mentioned photosensitive material has a superb photosensitivity as well as excellent light permeability and photocrosslinking property. Therefore, a photoset film of a satisfactory thickness can be easily obtained within a short period of time. Further, a via hole having a small diameter such as approx. 300 μm can be easily formed at a desired position on the film, which is absolutely impossible as far as a conventional photosensitive material is employed. Furthermore, the aromatic polyamide of the present invention does not require an additional photosetting agent for image formation, while the conventional non-photosensitive material such as polyamide or polyamide requires the use of the photosetting agent. Furthermore, the polyamide of the invention does not require the imidization process after the image formation, which is required in the use of the photosensitive polyamic acid (polyimide precursor) or polyamide amic acid. Consequently, using the polyamide of the invention, not only the overall process can be simplified but also many desirable effects can be achieved; for example, the stress or strain to solid state elements from thermal effects or shortening are avoided.

Moreover, the interlaminar insulating photoset polymer film formed using an aromatic polyamide of the invention, has an improved heat resistance and electrical and mechanical properties and satisfactorily adheres to a substrate. The aromatic polyamide of the invention also has satisfactory light permeability and photo-crosslinking property, so that it can be easily formed to give a film of approx. 30 to 80 μm thick. Since the photosensitive material of the photosensitive resin solution used in the process of producing multilayer printed circuit boards possesses various favorable properties as described above, and since an insulating film having at least one via hole can be formed directly on a circuit pattern, a multilayer printed circuit board can be advantageously produced by the process using such a photosensitive material.

The aromatic polyamide of the present invention not only has satisfactory heat resistance, high sensitivity, high resolving power and satisfactory adhesion to a substrate, but also is well soluble in an organic solvent. Accordingly, the aromatic polyamide of the invention is advantageously employable to produce a multilayer printed circuit board having interlaminar insulating films in which at least one via hole of satisfactorily small size is formed at any place of an insulating film.

Therefore, the present invention greatly contributes to development of electronic industries.

Synthesis examples for the diamine compound employable for producing the aromatic polyamide of the invention, preparation examples for the polyamide, and production examples for the multilayer printed circuit board of of the invention are given hereinbelow to illustrate the present invention in more detail without introducing any limitation to the invention.

SYNTHESIS EXAMPLE 1

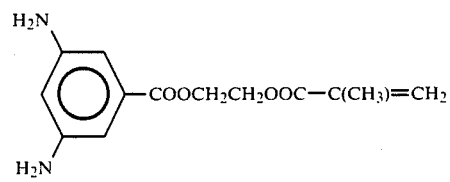

(1) Synthesis of 3,5-diaminobenzoic acid ethyleneglycol monomethacrylate ester

First Step: Synthesis of 3,5-dinitrobenzoic acid ethyleneglycol monomethacrylate To a solution of 29.6 g. of 2-hydroxyethyl methacrylate and 18.1 g. of pyridine in 200 ml of tetrahydrofuran (THF) was added dropwise a solution of 50 g. of 3,5-dinitrobenzoic acid chloride in 150 ml of THF at a temperature of 5° to 6° C. over a period of one hour by means of a dropping funnel. The resultant reaction mixture was stirred at a temperature of 10° to 15° C. for one hour. The resultant hydrochloric acid pyridine salt deposited from the reaction mixture was separated over a Buchner funnel filter. The filtrate was concentrated and then was poured into water to give a pale yellow precipitate.

The precipitate was washed several times by decantation and then dried under vacuum. 3,5-Dinitrobenzoic acid ethyleneglycol monomethacrylate ester was obtained in an amount of 60 g.

Second Step: Reduction of 3,5:dinitrobenzoic acid ethyleneglycol monomethacrylate A solution of 5 g. of the 3,5-dinitrobenzoic acid ethyleneglycol monomethacrylate ester obtained in the first step in 36 ml of acetic acid was added portionwise in amounts of from 2 to 4 each time to suspension of 27 g. of iron powder in a mixture of 15 ml of water and 35 ml of acetic acid at at temperature of 25±3° C. for period of approx. 20 minutes while the reaction mixture was stirred. Thereafter, the reaction mixture was additionally stirred for 10 minutes.

The reaction mixture was filtered over a Buchner funnel filter to remove an excessive portion of the iron powder. The filtrate was cooled to a temperature of approx. 0° C. by adding pieces of ice. Thereafter, the filtrate was adjusted to approx. pH 8.0 by addition of an aqueous ammonia solution. The filtrate was then subjected to extraction with ethyl acetate. The ethyl acetate extract solution was washed with water and dried. Subsequently, ethyl acetate was removed from the extract solution.

The crude product was obtained in an amount of 11.2 g. (yield: 67.5%) and purified by column chromatography. In the purifying operation, the crude material was placed on a column having a diameter of 65 mm and filled with 200 g. of silica gel (available under the trademark Wakogel C-200), and was purified using as a developing solvent a mixture of ethyl acetate and benzene (1:1, volume ratio). The purified product was obtained in an amount of 7.8 g.

The purified product had the following properties.
Melting point: 88° to 89° C.
Analysis (as $C_{13}H_{16}N_2O_4$):

|  | C | H | N |
| --- | --- | --- | --- |
| Observed (%) | 59.36 | 6.08 | 10.49 |
| Calculated (%) | 59.08 | 6.10 | 10.60 |

The obtained product was identified as the desired product according to infrared spectroscopy and H-NMR measurement.

PREPARATION EXAMPLE 1

(1) Preparation of polyamide

A three-necked flask purged with dry nitrogen gas was charged with 3 g. of lithium chloride and 31.714 g. of 3,5-diaminobenzoic acid ethyleneglycol monomethacrylate ester obtained in Synthesis Example 1. Further, 240 ml of N-methyl-2-pyrrolidone (NMP) was added to the mixture to give a solution. The solution was then cooled to a temperature of 3° C., and 24.364 g. of terephthalic acid dichloride was added while the mixture was stirred. The reaction was exothermic to elevate the temperature of the solution up to 34° C. The solution was stirred in an ice-cold water bath for thirty minutes and then at a room temperature for one hour and half.

The reaction mixture was diluted with 300 ml of NMP, and the diluted mixture was admixed with a mixture of 6 l of methanol and 6 l of water to precipitate a polyamide. The precipitate was collected by filtration and dried. 42.01 g. of the desired polyamide was obtained in the form of a white powder. The logarithmic viscosity of the polyamide in NMP (0.5 g./100 ml) measured at a temperature of 30° C. was 1.73.

(2) Preparation of photosensitive resin solution

To 30 g. of the polyamide powder obtained in the above (1), 150 g. of NMP (as an organic solvent), 1.2 g. of Michler's ketone (as a photo-polymerization initiator) and 0.15 g. each of hydroquinone and methyl ether hydroquinone (as thermal-polymerization inhibiters) were added.

The resultant mixture was well stirred to obtain a homogeneous viscous solution and filtrated under pressure to remove dusts, etc. Thus, a photosensitive resin solution having viscosity of 150 poise was prepared.

(3) Preparation of photoset film and physical properties thereof

The photosensitive resin solution prepared in the above (2) was poured into a sace defined by a spacer having a thickness of 700 μm which was placed on a copper plate. The solution was spread using a bar-coater to give a coated layer of an average thickness of 700 μm. The coated solution layer was dried in a hot-air drier at a temperature of approx. 70° C. for two hours, and a dry layer of a thickness of 75 μm was obtained. The dry layer was photoset under irradiation at 1 J/cm$^2$ using an extra-high pressure mercury lamp and then heat-treated at 150° C. for thirty minutes. A photoset film was thus obtained. Physical and chemical properties of the photoset film were examined, and their results are summarized in the following.
Tensile strength (kg/mm$^2$): 11.3.
Elongation (%): 16.7.
Adhesion (kg/cm$^2$):
  Glass-epoxy resin composite substrate: >64.
  Glass-polyimide resin composite substrate: >64.
  Copper-laminated board: >64.
Pencil hardness: >6H.
Shrinkage ratio (%): 14.8.
Thermo decomposition-initiating temperature (°C.): 310.
5% Weight decrease-initiating temperature (°C.): 362.
Thermal expansion coefficient (1/°C.).
  Room Temp. to 125° C.: $3.2 \times 10^{-5}$.
  125° C. to 250° C.: $1.1 \times 10^{-4}$.
Soldering heat resistance.
  (20 seconds) at 260° C.: normal.
  (20 seconds) at 300° C.: normal.
Thermal impact test: −65° C., 30 min—to-and-fro—125° C. 30 min. (film thickness 100 μm, 100 cycle): normal.

Dielectric constant (1 MHz, 25° C.): 4.2.
Dielectric loss tangent (1 MH$_3$, 25° C.): 0.040.
Volume resistivity (ohme·cm): $1.6 \times 10^{15}$.
Trichlene resistance (10 min., pencil hardness): normal (>6H).
Acid resistance (10% HCl, 10 min.): normal.
Alkali resistance (10% NaOH, 10 min.): normal.

In addition, the same thermal impact test was applied to a photoset film of a thickness of 150 μm made of a commercially available polyurethane photo-polymer, and it was observed that cracking was produced in the photoset film.

EXAMPLE 1

(1) Preparation of three-layer printed circuit board (i) Formation of copper circuit pattern in first layer A copper-coated glass-epoxy plate (substrate) was coated with Müron A (tradename: available from Muromachi Chemical Co., Ltd., negative type pattern resist). The coated substrate was covered with a mask film for the first layer circuit and exposed to radiation of 0.2 J/cm² provided by an extra-high pressure mercury lamp. The substrate was then developed in an aqueous solution containing 1.3% each of sodium carbonate and sodium phosphate and washed with water to form a thin film of Müron A coated over the circuit area of the first layer.

Subsequently, the substrate was immersed in an aqueous solution containing 65% of ferric chloride to etch away the unnecessary portion of copper. The substrate was then immersed in an aqueous sodium hydroxide solution to remove the thin film of Müron A. Thus, a copper circuit pattern of the first layer was formed.

(ii) Formation of polyamide film

The photosensitive resin solution prepared in the Preparation Example 1-(2) was poured into a space defined on the substrate having the first layer copper circuit prepared in the step (ii) above and a spacer having a thickness of 700 μm placed on the substrate, to form a coated layer of an average thickness of approx. 650 μm. The coated layer was then dried at 70° C. for 2 hrs., to give a dry polyamide layer of a thickness of 70 μm.

(iii) Formation of via holes

The surface of the polyamide layer formed in the step (ii) above was covered with a mask pattern for the preparation of through hole and exposed to radiation of 1 J/cm² provided by an extra-high pressure mercury lamp. The polyamide layer was developed in NMP by means of a ultrasonic cleaner at 28 kHz, 90 W for 3 min, to form via holes. The polyamide layer was further exposed to radiation of 5 J/cm², and heated at 150° C. for photosetting the polyamide layer. The photoset polyamide film served as an interlaminar insulating film in the following step.

(iv) Formation of copper circuit pattern of second layer

The interlaminar insulating film formed in the above step (iii) was surface-treated with a scrub-cleaner (available from Shipley Far East Ltd.), and on the surface of said interlaminar insulating film and the area of the via hole san electroless copper plating was applied using a reagent of MK series (tradename, available from Muromachi Chemical Co., Ltd.)

The electroless copper plated surface was coated with the Müron A resist and then covered with a mask film for the second layer circuit and exposed to radiation of 0.08 J/cm² provided by an extra-high pressure mercury lamp. The resist was developed on an aqueous solution containing 1.3% each of sodium carbonate and sodium phosphate, and washed with water to form a thin film of Müron A coated on the area except the circuit area of the second layer.

Subsequently, to apply an electro-plating onto the circuit area of the second layer in a copper sulfate bath, a copper plate was connected to the anode and the substrate was connected to the cathode according to the CuBrite Process (available from Ebara-Udylite Co., Ltd.). Then, an electro-plating was performed at 2 A/dm for 1 hr. The substrate was immersed in 3% aqueous sodium hydroxide solution to peel off the thin film of Muron A, and successively immersed in 20% aqueous ammonium persulfate for several seconds to etch away the unnecessary portion of the above electroless copper plated area formed by the previous treatment. The circuit pattern of the second layer was thus obtained.

(v) Formation of copper circuit pattern of third layer.

The steps (ii) to (iv) were repeated to form a copper circuit pattern of the third layer.

(2) Thermal impact test

The thermal impact test on the three-layer printed circuit board produced in the above (1) was performed according to MIL-STD-202D-107 (−65° C., 30 min.—to and fro—125° C., 30 min., 100 cycles). No cracking was observed. Further, the circuit board was examined on the electric connection. No abnormal behavior was observed.

PREPARATION EXAMPLE 2

(1) Preparation of polyamide powder

A three-necked flask purged with dry nitrogen gas was charged with of 3 g. of lithium chloride and 31.714 g. of 3.5-diaminobenzoic acid ethyleneglycol monomethacrylate ester obtained in Synthesis Example 1. Into the flask was then introduced 240 ml of N-methyl-2-pyrrolidone (NMP) to dissolve the solid agents. The solution was then cooled to a temperature of 2° C., and to this was added 24.364 g. of terephthalic acid dichloride while the resultant mixture was stirred. The reaction here was exothermic to elevate the temperature of the solution up to 32° C. The solution was stirred in an ice-cold water bath for 30 min. and then at room temperature for one hour and half. The reaction mixture was diluted with 300 ml of NMP.

Subsequently, a solution of 30 ml of NMP containing 25.8 g. of methacrylic acid chloride was added dropwise to the above diluted reaction solution for 30 min. The reaction was exothermic to elevate the temperature of the solution up to 35° C.

After the reaction was complete, the solution was admixed with a mixture of 6 l of methanol with 6 l of water to precipitate a polyamide. The precipitate was collected by filtration and dried. There was obtained 51 g. of a polyamide in the form of a white powder. The logarithmic viscosity of the obtained polyamide (0.5 g. of polyamide in 100 ml of NMP, measured at 30° C.) was 1.77.

(2) Preparation of photosensitive resin solution

Using the polyamide powder prepared in the above (1), a photosensitive resin solution having a viscosity of approx. 170 poise was prepared in the same manner as in the step (2) of Preparation Example 1.

EXAMPLE 2

The photosensitive resin solution prepared in the Preparation Example 2-(1) was used to produce a three-layer printed circuit board in the same manner as in Example 1.

The thermal impact test was performed on the produced three-layer printed circuit board produced in the same manner as in Example 1. No cracking was observed. Further, the circuit board was examined on the electric connection. No abnormal behavior was observed.

We claim:

1. In a multilayer printed circuit board comprising an insulating substrate and a plurality of circuit elements provided thereon in layers, each of which comprises a circuit pattern and an insulating resin layer provided over the circuit pattern, the circuit patterns being arranged adjacent to each other and being portionwise connected electrically through at least one hole in an insulating resin layer therebetween, the improvement wherein said insulating resin layer comprises an aromatic polyamide photoset resin, said aromatic polyamide comprising:

at least 10 molar % of a constitutional unit of the formula (Ia):

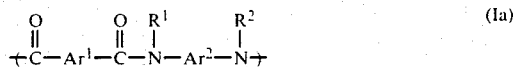

wherein each of $R^1$ and $R^2$ independently is a hydrogen atom or a residue of a reactive organic compound selected from the group consisting of the acetyl, acryloyl, methacryloyl, cinnamoyl and p-azidobenzoyl, $Ar^1$ is a divalent aromatic residue of an aromatic dicarboxylic acid compound and $Ar^2$ is a divalent aromatic residue of an aromatic diamine compound containing a photosensitive group, and at most 90 molar % of a constitutional unit of the formula (Ib):

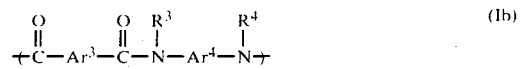

wherein each of $R^3$ and $R^4$ independently is a hydrogen atom or a residue of a reactive organic compound selected from the group consisting of acetyl, acryloyl, methacryloyl, cinnamoyl and p-azidobenzoyl, $Ar^3$ is a divalent aromatic residue of an aromatic dicarboxylic acid compound and $Ar^4$ is a divalent aromatic residue of an aromatic diamine compound.

2. The multilayer printed circuit board as claimed in claim 1, in which the aromatic polyamide contains at least 20 molar % of the constitutional unit of the formula (Ia).

3. The multilayer printed circuit board as claimed in claim 2, in which the aromatic polyamide contains at least 40 molar % of the constitutional unit of the formula (Ia).

4. The multilayer printed circuit board as claimed in claim 3, in which the aromatic polyamide contains 80 to 100 molar % of the constitutional unit of the formula (Ia).

5. The multilayer printed circuit board as claimed in claim 1, in which the aromatic polyamide shows a logarithmic viscosity in the range of 0.1 to 3.5, the value being measured in the form of a solution of 100 ml of N-methyl-2-pyrrolidone containing 0.5 g. of the polyamide at a temperature of 30° C.

6. The multilayer printed circuit board as claimed in claim 2, in which the aromatic polyamide shows a logarithmic viscosity in the range of 0.1 to 3,5, the value being measured in the form of a solution of 100 ml of N-methyl-2-pyrrolidone containing 0.5 g. of the polyamide at a temperature of 30° C.

7. The multilayer printed circuit board as claimed in claim 3, in which the aromatic polyamide shows a logarithmic viscosity in the range of 0.1 to 3.5, the value being measured in the form of a solution of 100 ml of N-methyl-2-pyrrolidone containing 0.5 g. of the polyamide at a temperature of 30° C.

8. The multilayer printed circuit board as claimed in claim 4, in which the aromatic polyamide shows a logarithmic viscosity in the range of 0.1 to 3.5, the value being measured in the form of a solution of 100 ml of N-methyl-2-pyrrolidone containing 0.5 g. of the polyamide at a temperature of 30° C.

* * * * *